United States Patent
Aceña et al.

(10) Patent No.: US 9,851,387 B2
(45) Date of Patent: Dec. 26, 2017

(54) HVIL SIGNAL GENERATOR AND DETECTOR WITH LOOP DIAGNOSTICS

(71) Applicant: LEAR CORPORATION, Southfield, MI (US)

(72) Inventors: Miguel Angel Aceña, Valls (ES); Youssef Ghabbour, Valls (ES); Jose Gabriel Fernández Bañares, Valls (ES)

(73) Assignee: Lear Corporation, Southfield, MI (US)

(*) Notice: Subject to any disclaimer, the term of this patent is extended or adjusted under 35 U.S.C. 154(b) by 0 days.

(21) Appl. No.: 15/095,794

(22) Filed: Apr. 11, 2016

(65) Prior Publication Data
US 2017/0292982 A1 Oct. 12, 2017

(51) Int. Cl.
| | |
|---|---|
| *G01R 31/14* | (2006.01) |
| *G01R 31/00* | (2006.01) |
| *G01R 31/02* | (2006.01) |
| *G01R 31/08* | (2006.01) |

(52) U.S. Cl.
CPC ......... *G01R 31/005* (2013.01); *G01R 31/025* (2013.01); *G01R 31/026* (2013.01); *G01R 31/08* (2013.01)

(58) Field of Classification Search
CPC .... G01R 31/05; G01R 31/025; G01R 31/026; G01R 31/08; G01R 31/083; G01R 31/086; G01R 31/088; G01R 31/085; G01R 31/2829; G01R 31/14; G01R 27/18
USPC .......................................... 324/509, 522, 523
See application file for complete search history.

(56) References Cited

U.S. PATENT DOCUMENTS

| | | | | |
|---|---|---|---|---|
| 5,343,461 A | * | 8/1994 | Barton | H04J 3/14 370/249 |
| 6,262,871 B1 | * | 7/2001 | Nemir | G01R 31/327 324/424 |
| 6,519,538 B1 | * | 2/2003 | Bowman | H02M 3/00 324/176 |
| 7,084,361 B1 | | 8/2006 | Bowes et al. | |
| 7,253,629 B1 | * | 8/2007 | Richards | G01R 31/3277 324/424 |
| 7,586,722 B2 | | 9/2009 | Scholer et al. | |
| 7,703,862 B2 | * | 4/2010 | Abe | B60T 8/368 303/119.3 |
| 7,999,668 B2 | | 8/2011 | Cawthorne et al. | |

(Continued)

FOREIGN PATENT DOCUMENTS

| | | |
|---|---|---|
| DE | 102010048348 A1 | 5/2011 |
| EP | 2489541 A1 | 8/2012 |

*Primary Examiner* — Thang Le
(74) *Attorney, Agent, or Firm* — Fishman Stewart PLLC

(57) ABSTRACT

A high voltage power monitoring system includes a controller, a detector connected to the controller, and a generator connected to the detector and the controller. The generator may be configured to generate a plurality of test signals according to control signals generated via the controller. The generator may provide the test signals to the detector. The detector may be configured to provide the plurality of test signals to a test loop. The detector may be configured to simultaneously sense a first voltage, a second voltage, a first current, and a second current. The first voltage and the first current may correspond to a first test signal of the plurality of test signals. The second voltage and the second current may correspond to a returned version of the first test signal that has passed through the test loop.

21 Claims, 7 Drawing Sheets

(56) References Cited

U.S. PATENT DOCUMENTS

| | | | |
|---|---|---|---|
| 8,199,449 B2 | 6/2012 | Kuschnarew et al. | |
| 8,466,586 B2 | 6/2013 | Tarchinski et al. | |
| 9,250,283 B2* | 2/2016 | Johnson | G01R 31/11 |
| 9,335,366 B2* | 5/2016 | Handy | G01R 31/2829 |
| 2013/0241506 A1* | 9/2013 | Yang | G05F 1/62 |
| | | | 323/282 |
| 2014/0062180 A1* | 3/2014 | Demmerle | H01H 51/28 |
| | | | 307/9.1 |
| 2014/0292346 A1* | 10/2014 | Arnold | B60L 3/0069 |
| | | | 324/503 |
| 2016/0202302 A1* | 7/2016 | Cooper | G01R 31/086 |
| | | | 324/503 |

* cited by examiner

HVIL SIGNAL GENERATOR AND DETECTOR WITH LOOP DIAGNOSTICS

TECHNICAL FIELD

The present disclosure relates to electrical components and electrical power systems, including vehicle high voltage systems.

BACKGROUND

In certain high voltage systems, such as those that may be present in vehicles, it may be desirable to monitor high voltage systems to ensure that persons are not exposed to high voltage. For example, it may be desirable to shut down high voltage systems in the event of a disconnection of a connector or the removal of a cover to prevent a person from inadvertently contacting live high voltage components. Vehicles may include, for example, a high voltage network and a low voltage network, and conventional monitoring systems (e.g., high voltage interlock loops, HVILs) may be connected to one or more components/devices in these networks. However, it may be desirable to monitor high voltage systems in different ways and/or to obtain detailed information regarding detected errors.

SUMMARY

In embodiments, a high voltage power monitoring system may comprise a controller, a detector connected to the controller, and a generator connected to the detector and the controller. The generator may be configured to generate a plurality of test signals according to control signals generated via the controller, and provide the test signals to the detector. The detector may be configured to provide the plurality of test signals to a test loop. The detector may be configured to sense a first voltage, a second voltage, a first current, and a second current. The first voltage and the first current may correspond to a first test signal of the plurality of test signals, and the second voltage and the second current may correspond to a returned version of the first test signal that has passed through the test loop.

In embodiments, a high voltage monitoring system may comprise a detector configured to communicate with a controller and a generator connected to the detector and configured to communicate with the controller. The generator may be configured to generate a test signal according to a control signal generated via the controller, and provide the test signal to the detector. The test signal may include a first state and a second state. The generator may be configured to provide the test signal to a test loop via the detector. The detector may be configured to sense a first voltage, a first current, a second voltage, and a second current. The first voltage and the first current may correspond to the test signal in its first state, and the second voltage and the second current may correspond to a returned version of the test signal in its first state that has passed through the test loop. The detector may be configured to sense a third voltage, a third current, a fourth voltage, and a fourth current. The third voltage and the third current may correspond to the test signal in its second state, and the fourth voltage and the fourth current may correspond to a returned version of the test signal in its second state that has passed through the test loop.

DETAILED DESCRIPTION

Reference will now be made in detail to embodiments of the present disclosure, examples of which are described herein and illustrated in the accompanying drawings. While the disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure.

Figure 1:
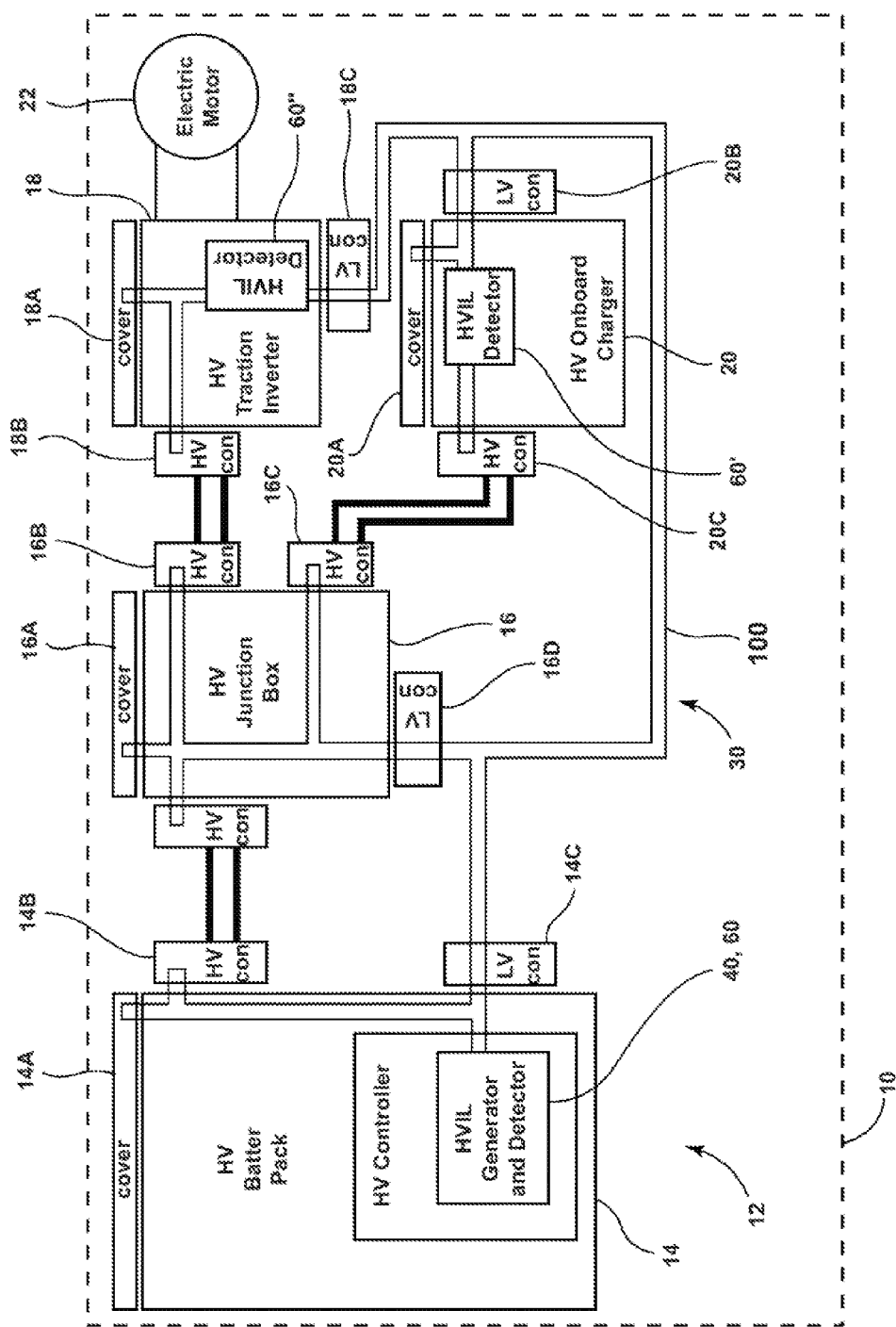
FIG. 1 is a diagrammatic view of a high voltage monitoring system in accordance with teachings of the present disclosure.

In embodiments, such as generally illustrated in FIG. 1, a high voltage network 12 may include a high voltage power source 14 (e.g., a high voltage battery pack), a high voltage junction box 16, a high voltage inverter 18 (e.g., a traction inverter), a high voltage charger 20 (e.g., onboard a vehicle 10), and/or an actuator 22 (e.g., an electric motor). In embodiments, high voltage network 12 may, for example, be disposed in and/or connected to a vehicle 10. In embodiments, power source 14 may be configured to provide a voltage of about 400 volts. In other embodiments, for example and without limitation, power source 14 may be configured to provide lower voltages, such as 12 volts or 14 volts (or even lower), and/or higher voltages, such as, for example, 36 volts, 48 volts, 100 volts, 500 volts, 850 volts, 2000 volts, 3000 volts, or even higher.

Figure 2:
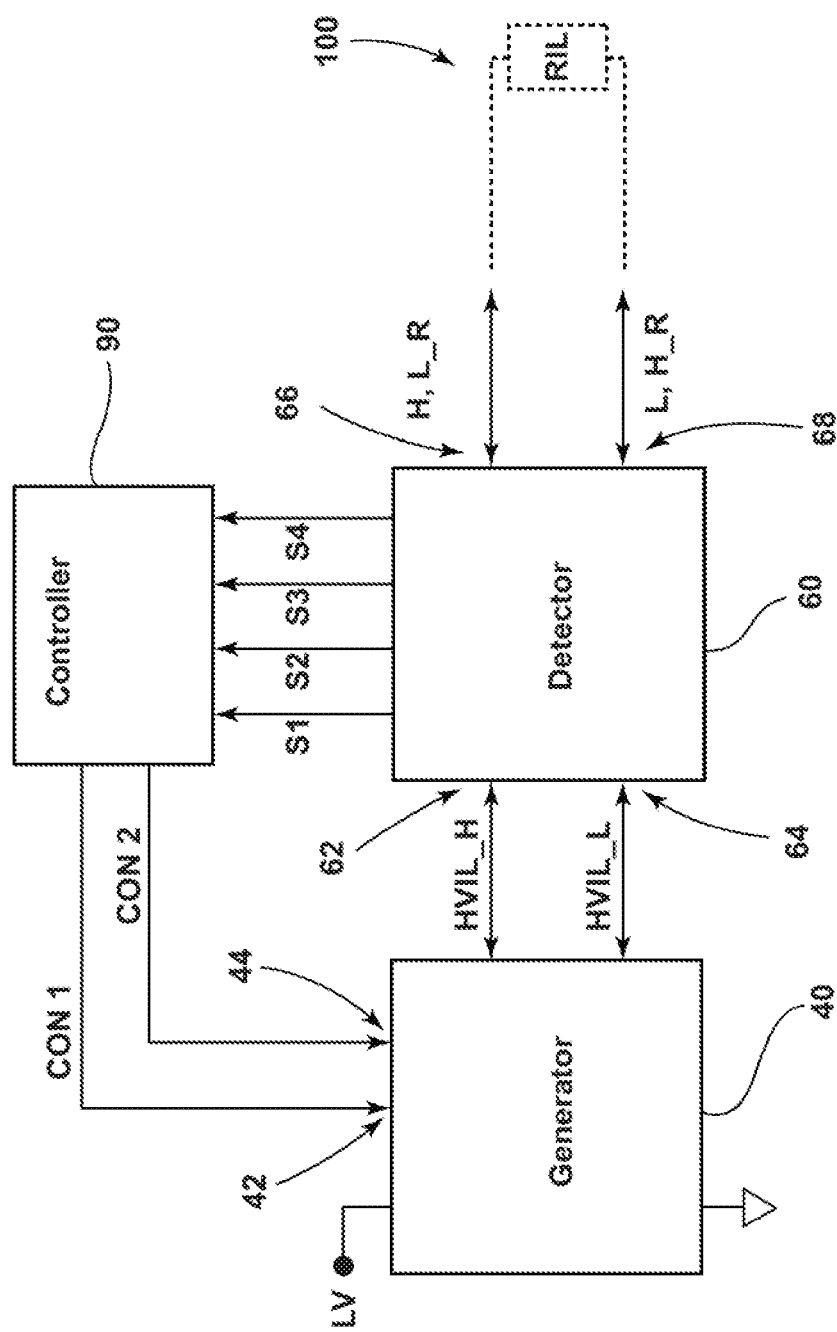
FIG. 2 is a diagrammatic view of an embodiment of a high voltage monitoring system in accordance with teachings of the present disclosure.

In embodiments, a high voltage monitoring system 30 may be configured to monitor network 12 and/or may be connected to network 12. Monitoring system 30 may include and/or may be configured as a high voltage interlock loop (HVIL). Monitoring system 30 may be configured to detect errors in network 12 and/or may be configured to provide an indication of detected errors. In embodiments, such as generally illustrated in FIGS. 1 and 2, monitoring system 30 may include a generator 40 (e.g., an electronic generator), one or more detectors 60 (e.g., electronic detectors), a controller 90, and/or an HVIL test loop 100.

In embodiments, controller 90 may include an electronic controller and/or include an electronic processor, such as a programmable microprocessor and/or microcontroller. In embodiments, controller may include, for example, an application specific integrated circuit (ASIC). Controller 90 may include a central processing unit (CPU), memory, and/or an input/output (I/O) interface. Controller 90 may be configured to perform various functions, including those described in greater detail herein, with appropriate programming instructions and/or code embodied in software, hardware, and/or other medium. In embodiments, controller 90 may include a plurality of controllers and/or may be distributed among various portions of network 12. For example, controller 90 may be disposed in and/or connected to power source, and controller 90 may include a second controller 92 and/or a third controller 94. Second controller 92 may be disposed in and/or connected to inverter 18, and may be configured to control operation of inverter 18. Third controller 94 may be disposed in and/or connected to charger 20, and may be configured to controller operation of charger 20. In embodiments, controllers 90, 92, 94 may be connected (e.g., electrically, digitally, wirelessly, etc.) to each other.

Figure 3A:
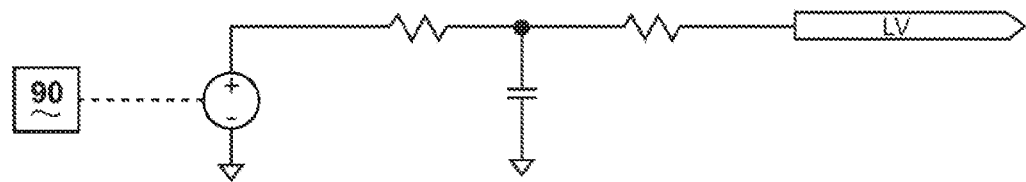
FIGS. 3A-3C are diagrammatic views of portions of embodiments of high voltage monitoring systems in accordance with teachings of the present disclosure.
Figure 3B:
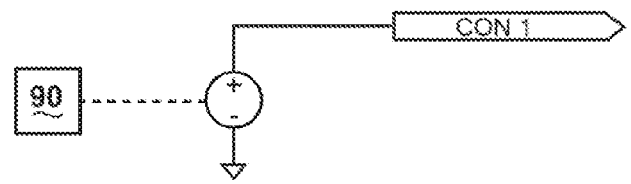
Figure 3B:
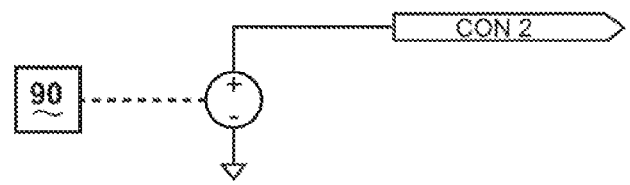
Figure 3C:
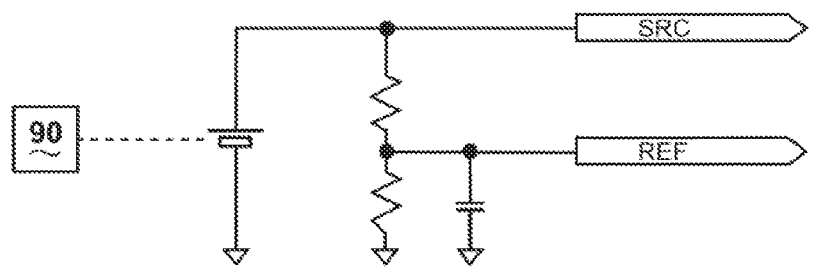
Figure 4:
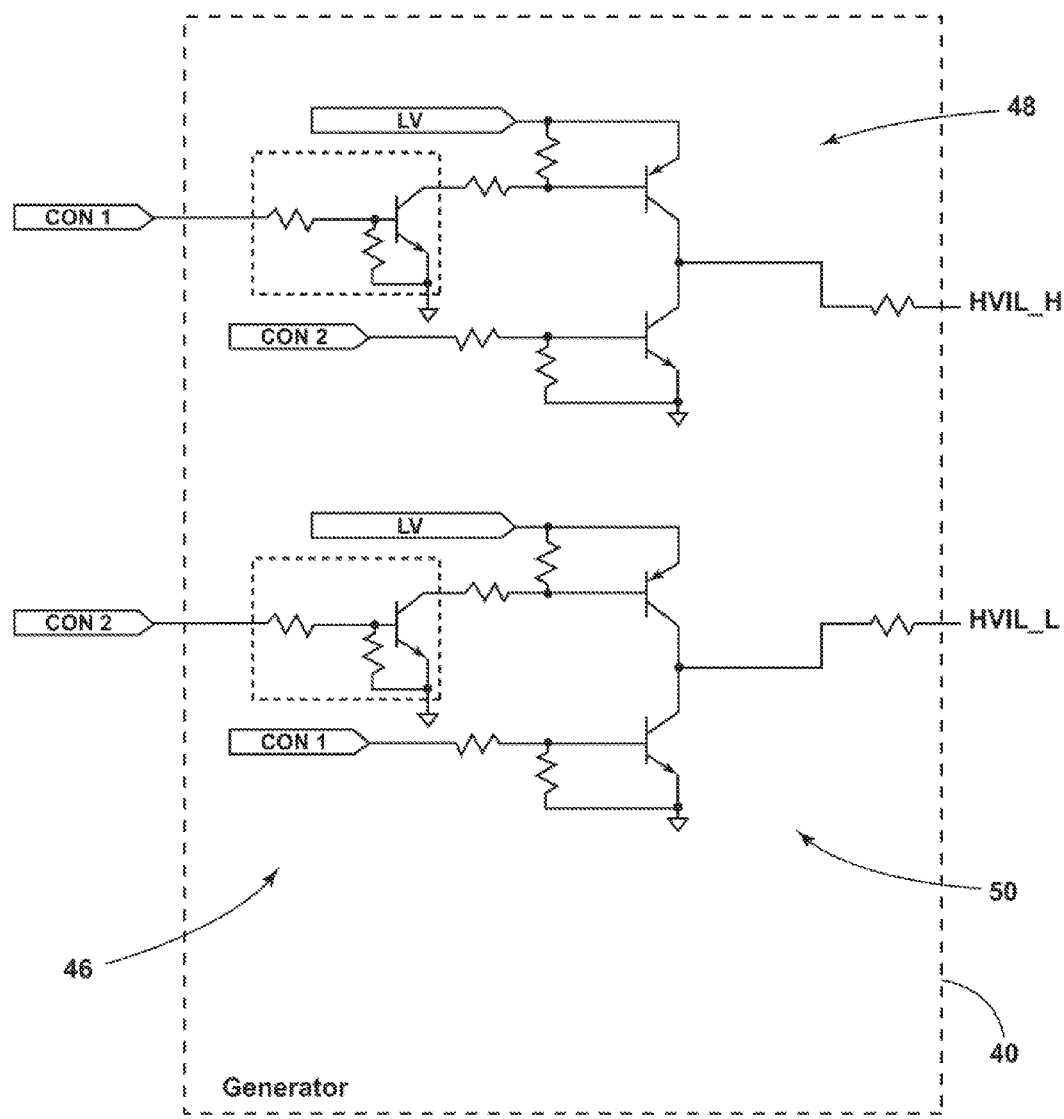
FIG. 4 is a diagrammatic view of an embodiment of a generator of a high voltage monitoring system in accordance with teachings of the present disclosure.

With embodiments, such as generally illustrated in FIGS. 3A, 3B, 3C, 4, and 5, generator 40 and/or detector 60 may be configured to received one or more inputs (e.g., data/signals). In embodiments, controller 90 may be configured to provide and/or control the inputs. For example, such as generally illustrated in FIGS. 3A and 4, controller 90 may be configured to cause a signal LV to be provided to generator 40 that may be configured as a supply voltage for generator 40. Signal LV may include a low voltage, such as about 12 volts or about 14 volts.

Figure 6:
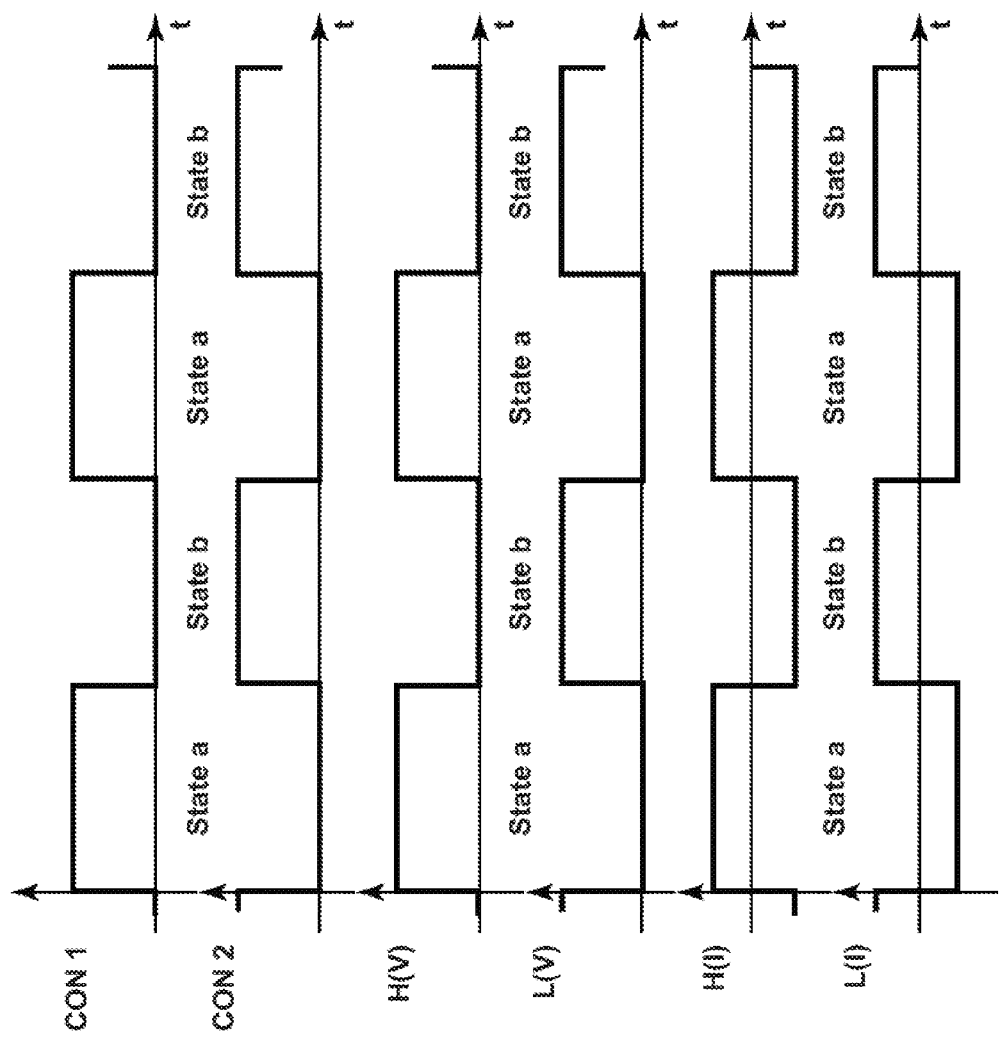
FIG. 6 is a graphical view of signals of an embodiment of a high voltage monitoring system in accordance with teachings of the present disclosure.

In embodiments, such as generally illustrated in FIGS. 3B, 4, and 6, controller 90 may provide and/or cause to be provided a first control signal CON1 and/or a second control signal CON2 to generator 40. In embodiments, first control signal CON1 may be provided to a first input 42 of generator 40 (e.g., a first input pin), and/or second control signal CON2 may be provided to a second input 44 of generator 40 (e.g., a second input pin). In embodiments, controller 90 may be configured to control generator 40 via a single control signal (e.g., CON1).

Figure 5:
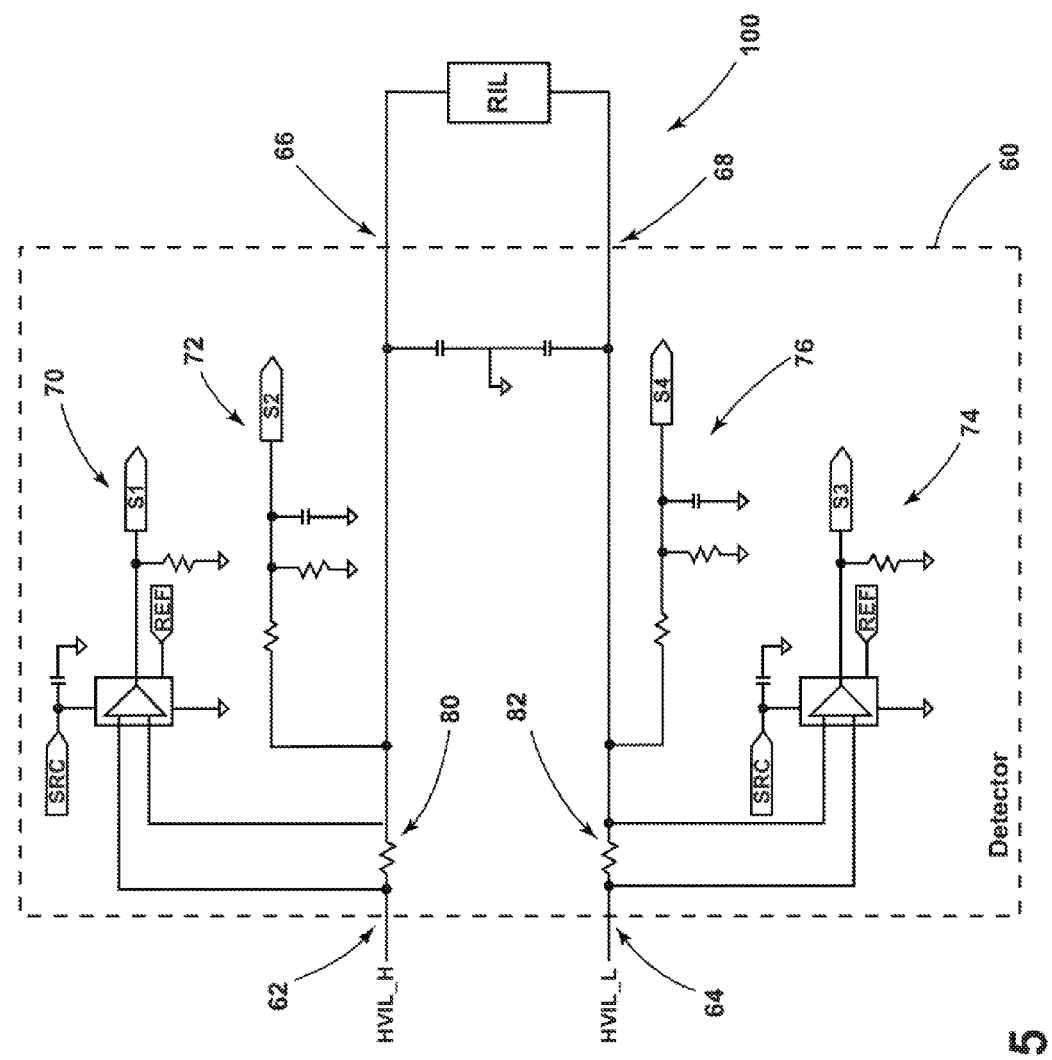
FIG. 5 is a diagrammatic view of portions of an embodiment of a detector of a high voltage monitoring system and a high voltage network in accordance with teachings of the present disclosure.

In embodiments, such as generally illustrated in FIGS. 3C and 5, controller 90 may be configured to provide and/or cause to be provided a source voltage SRC to detector 60. Source voltage SRC may, for example, be about 5 volts, and source voltage SRC may be provided to (e.g., electrically connected with) a current sensor (e.g., first sensor 70 and/or third sensor 74) of detector 60. Additionally or alternatively, in embodiments, controller 90 may be configured to provide and/or cause to be provided a reference voltage REF to detector 60. The reference voltage REF may, for example, be about 2.5 volts, and may be provided to a current sensor (e.g., first sensor 70 and/or third sensor 74) of detector 60.

With embodiments, such as generally illustrated in FIG. 2, generator 40 may be connected to low voltage signal LV, such as from a conventional vehicle electrical system (e.g., about 14 volts). In embodiments, such as generally illustrated in FIGS. 2 and 4, generator 40 may be configured to receive first control signal CON1 and/or second control signal CON2 provided via controller 90. Generator 40 may be configured to generate a first generator signal HVIL_H according to first control signal CON1, and/or generate a second test signal HVIL_L according to second control signal CON2. For example, and without limitation, first generator signal HVIL_H may include an 88 Hz pulse width modulation (PWM) signal that may include an initial active state/high value (e.g., 5 volts), and/or second generator signal HVIL_L may include an 88 Hz pulse width modulation (PWM) signal that may include an initial inactive state/low value (e.g., 0 volts). First generator signal HVIL_H and second test signal HVIL_L may be configured such that only one of the two signals is in an active state (e.g., includes a high value) at any one time (see, e.g., FIG. 6). For example, and without limitation, first test signal HVIL_H and second test signal HVIL_L may be mirror images of each other, include generally the same frequency (e.g., 88 Hz), include generally the same duty cycle (e.g., about 50%±2%), include generally the same edge steepness (e.g., at least 105 volts per second), and/or may be time-shifted copies of each other (e.g., by half of a period). In embodiments, first test signal H may include the opposite polarity of second test signal L. In embodiments, generator 40 may generate first generator signal HVIL_H and second generator signal HVIL_L according to a single control signal (e.g., CON1) provided via controller 90.

With embodiments, generator 40 may include a transistor H-bridge 46. In embodiments, a first portion 48 of generator 40 may be configured to generate first test signal HVIL_H according to first control signal CON1, and/or a second portion 50 of the generator 40 may be configured to generate second test signal HVIL_L according to second control signal CON2. In embodiments, generator 40 may be configured to generate one or more other types of signals. For example, and without limitation, generator 40 may be configured to generate a signal, such as a pulse signal, that may be used to determine the location of a fault (e.g., a short circuit and/or an open) in test loop 100. Such signals may be used, for example, during servicing and/or maintenance operations.

In embodiments, such as generally illustrated in FIG. 5, detector 60 may be configured to receive first test signal HVIL_H and/or second test signal HVIL_L (e.g., from generator 40) at a first input 62 (e.g., a pin) and a second input 64 (e.g., a pin), respectively. In a first system state/mode a, detector 60 may be configured to provide a first test signal H, which may correspond to first generator signal HVIL_H (e.g., be a version of), to HVIL test loop 100 via a first detector output 66 (e.g., a pin) and may be configured to receive a returned version H_R of first test signal H at a second detector output 68 (e.g., a pin) after first test signal H has been provided to and/or conducted through HVIL test loop 100.

In a second system state/mode b, detector 60 may be configured to provide second test signal L, which may correspond to second generator signal HVIL_L, to HVIL test loop 100 at second output 68 and may be configured to receive a returned version L_R of second test signal L at first output 66 after second test signal L has been provided to and/or conducted through HVIL test loop 100. The state of monitoring system 30 may be controlled by controller 90 via first control signal CON1 and/or second control signal CON2. For example, and without limitation, if first control signal CON1 is active/high (and second control signal CON2 is inactive/low), system 30 may be in a first state a, and if the second control signal CON2 is active/high (and first control signal CON1 is inactive/low), system 30 may be in a second state b.

In embodiments, such as generally illustrated in FIG. 6, detector 60 may provide first test signal H and second test signal L to HVIL test loop 100 simultaneously (e.g., with first test signal H in either an active state or an inactive state, and second test signal L in the other state). In embodiments, first test signal H and second test signal L may or may not include the same duty cycle.

Although first test signal H and second test signal L are described as two distinct signals for illustrative purposes, first test signal H and second test signal L may define a single differential mode signal or a single common mode signal, and may include a first state and a second state. For example, and without limitation, a single/combined test signal (of signals H and L) may be in its first state when system 12 is in its first mode a, and the single/combined test signal may be in it second state when system 12 is in its second mode b.

Generator 30 and detector 60 may be configured cooperate to generate an alternating current loop through HVIL test loop 100 via first test signal H and second test signal L. First test signal H and/or second test signal L may include current-limited PWM signals.

With embodiments, such as generally illustrated in FIG. 5, detector 60 may include a first sensor 70 and/or a second sensor 72 that may be configured to sense (e.g., monitor, measure, detect, etc.) one or more characteristics of the first test signal H and/or returned second signal L_R. Additionally or alternatively, detector 60 may include a third sensor 74 and/or a fourth sensor 76 that may be configured to sense one or more characteristics of second signal L and/or the returned version of first test signal H_R. For example and without limitation, first sensor 70 and third sensor 74 may include current sensors, and/or second sensor 72 and fourth sensor 76 may include voltage sensors.

With embodiments, current sensors (e.g., first sensor 70, third sensor 74) may be configured to output voltage signal S1, S3 corresponding to a sensed current through a shunt resistor of detector (e.g., first shunt resistor 80 or second shunt resistor 82). For example, and without limitation, first sensor 70 and/or third sensor 74 may include a current shunt monitor integrated circuit. In embodiments, first sensor 70 and/or third sensor 74 may be connected with source voltage SOURCE (e.g., 5V) and/or reference voltage REF (e.g., 2.5V) that may be provided to detector via controller.

In embodiments, the returned second test signal L_R may pass through first shunt resistor 80, and first sensor 70 may be configured to sense the current I1_b of returned second test signal L_R. In embodiments, returned first test signal H_R may pass through second shunt resistor 82, and third sensor 74 may be configured to sense the current I2_a of returned first test signal H_R. In embodiments, first sensor 70 and third sensor 74 may be configured to simultaneously sense the current I1_a of first test signal H via the first shunt resistor 80 and sense the current I2_a of returned first test signal H_R via the second shunt resistor 82. Additionally or alternatively, first sensor 70 and third sensor 74 may be configured to simultaneously sense the current I2_b of second test signal L via second shunt resistor 82 and sense the current I1_b of returned second test signal L_R via first shunt resistor 80.

In embodiments, voltage sensors (e.g., second sensor 72, fourth sensor 76) may be configured to output voltage signals S2, S4 corresponding to the voltage VH_a of first test signal H and second test signal L, and/or their returned versions, H_R, L_R. For example, and without limitation, second sensor 72 and/or fourth sensor 76 may include a voltage divider. Second sensor 72 may be configured to sense a voltage at or about first shunt resistor 80 (e.g., a voltage VH_a of first test signal H and/or a voltage VH_b of returned second test signal L_R). Fourth sensor 76 may be configured to sense a voltage at or about second shunt resistor 82 (e.g., a voltage VL_b of second test signal L and/or a voltage VL_a of returned second test signal L_R).

In embodiments, controller 90 may be configured to control and/or monitor network 12, such as via HVIL test loop 100. For example, and without limitation, controller 90 may monitor HVIL test loop 100 via outputs from one or more of first sensor 70, second sensor 72, third sensor 74, and fourth sensor 76. Controller 90 may monitor sensor outputs synchronously, including when system 30 is in first state a and when system 30 is in second state b.

Figure 7:
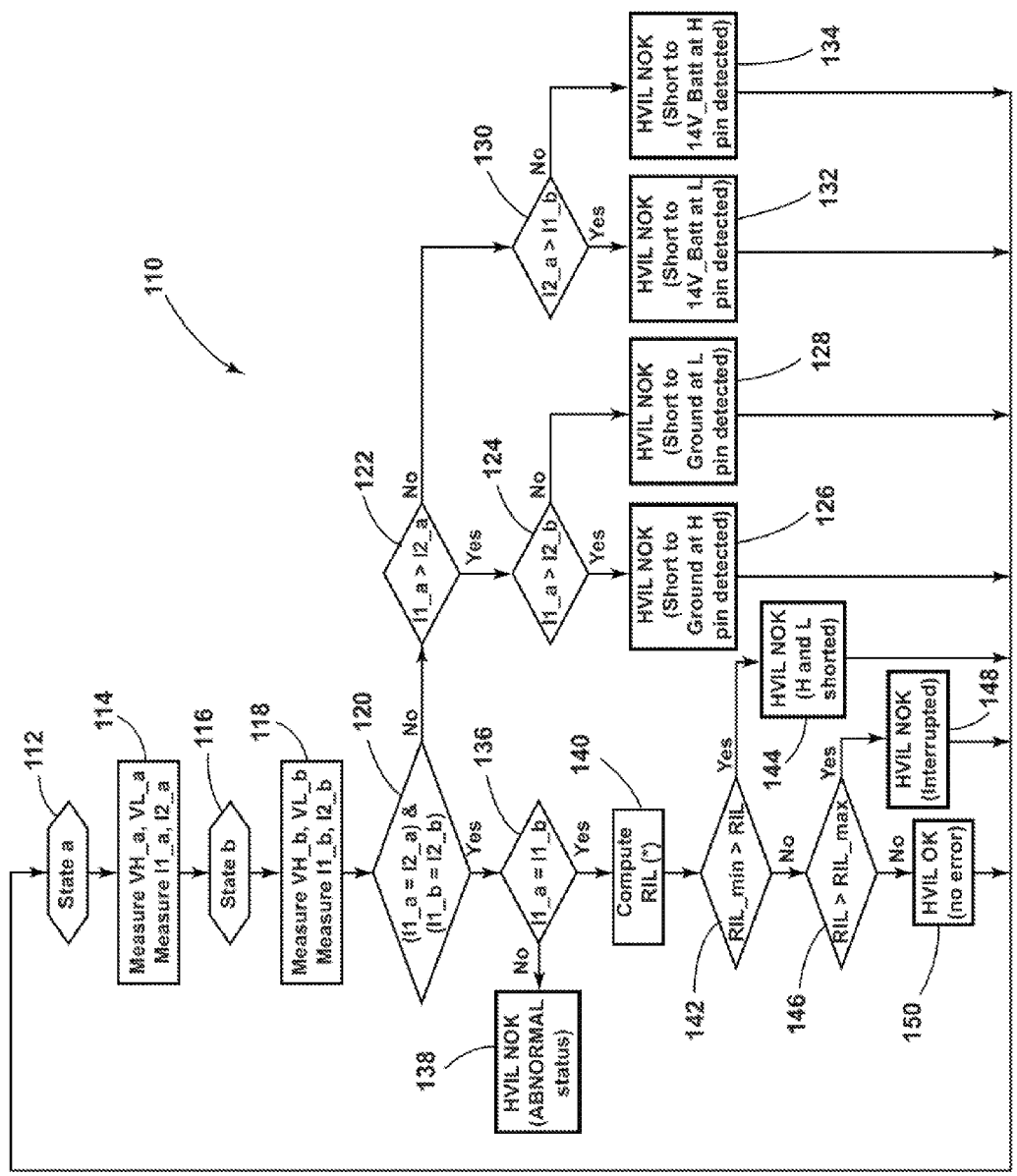
FIG. 7 is a flow diagram of an embodiment of a high voltage monitoring system in accordance with teachings of the present disclosure.

Controller 90 may be configured to determine a system status according to the sensor outputs, such as via the method 110 generally illustrated in FIG. 7. In step 112, controller 90 may set system 30 to first state a (e.g., via causing first control signal CON1 to be active). Generator 40 may generate first generator signal HVIL_H and provide it to detector 60, and detector 60 may provide corresponding first test signal H to HVIL test loop 100. In step 114, first sensor 70 may sense the current I1_a of first test signal H, second sensor 72 may sense the voltage VH_a of first test signal H, third sensor 74 may sense the current I2_a of returned first test signal H_R, and/or fourth sensor 76 may sense the voltage VL_a of the returned first test signal H_R.

In step 116, controller 90 may set system 30 to second state b (e.g., via causing second control signal CON2 to be active). Generator 40 may generate second generator signal HVIL_L and provide it to detector 60, and detector 60 may provide corresponding second test signal L to HVIL test loop 100. In step 118, third sensor 74 may sense the current I2_a of second test signal L, fourth sensor 76 may sense the voltage VL_b of second test signal L, first sensor 70 may sense the current I1_b of returned second test signal L_R, and/or second sensor 72 may sense the voltage VH_b of returned second test signal L_R.

In step 120, controller may compare the sensed currents I1_a, I2_a of the first test signal H and its returned version H_R, and/or may compare the sensed currents I1_b, I2_b of the second test signal L and its returned version L_R. If the sensed currents for either of the test signals H, L are not within a specified or predetermined range (e.g., an acceptable/expected error range) of the sensed currents for their respective returned versions H_R, L_R, controller 90 may determine/indicate an system condition or system state (e.g., an error condition), which may include, for example, that network/HVIL test loop 100 includes an unbalanced circuit.

If an unbalanced circuit is detected, controller 90 may proceed to determine additional information about the error. For example, and without limitation, controller 90 may, in step 122, compare the sensed current I1_a of first test signal H to the sensed current I2_a of the returned first test signal H_R.

If current I1_a is greater than current I2_a, controller 90 may indicate an error condition in which network 12/HVIL test loop 100 has been pulled down to ground (e.g., electrical ground), and controller 90, in step 124, may compare current I1_a with the sensed current I2_b of the second test signal L. If current I1_a is greater than sensed current I2_b, controller 90 may indicate an error condition 126 in which an electrical short to ground is present at first detector pin 62. If current I1_a is not greater than sensed current I2_b, controller 90 may indicate an error condition 128 in which an electrical short to ground is present at second detector pin 64.

If controller 90 detects an unbalanced circuit and current I1_a is not greater than current I2_a, controller 90 may, in step 130, compare the sensed current I2_a of returned first test signal H_R with the sensed current I1_b of returned second test signal L_R. If current I2_a is greater than current I1_b, controller 90 may indicate an error condition 132 in which an electrical short to a low voltage source (e.g., 14 volts) is present at second detector pin 64. If current I2_a is not greater than current I1_b, controller 90 may indicate an error condition 134 in which an electrical short to low voltage source LV (e.g., a 14 volt source) is present at first detector pin 62.

If an unbalanced circuit is not detected, controller 90, in step 136, may compare the sensed current I1_a of the first test signal H and the sensed current I1_b of the second test signal L. If current I1_a and current I1_b are not within a predetermined range of each other (e.g., within an acceptable/expected error range), controller 90 may indicate an abnormal status 138, such as because of an unexpected nonlinear event, unexpected diode behavior, or other errors.

If current I1_a and current I1_b are within a specified or predetermined range, controller 90 may, in step 140, determine a resistance RIL of HVIL test loop 100. Resistance RIL may correspond to the difference between voltage VH_a and voltage VL_a, divided by current I1_a. Additionally or alternatively, resistance RIL may correspond to the difference between voltage VL_b and voltage VH_b, divided by current I2_b. In step 142, controller 90 may compare the computed test loop resistance RIL to a predetermined resistance minimum RIL_min. If resistance RIL is not at least as large as minimum resistance RIL_min, controller 90 may indicate an error condition 144 in which detector first pin 62 and detector second pin 64 are shorted. If resistance RIL is at least as large as minimum resistance RIL_min, controller 90 may, in step 146, compare resistance RIL to a predetermined maximum resistance RIL_max. If resistance RIL is greater than maximum resistance RIL_max, controller 90 may indicate an error condition 148 in which at least a portion of HVIL test loop 100 has been interrupted (e.g., between first pin 62 and second pin 64). If resistance RIL is within a predetermined/expected range (e.g., within a range defined by RIL_min and RIL_max), controller 90 may indicate that no errors have been detected 150. In embodiments, minimum resistance RIL_min may, for example, be about 10 Ohms, and/or maximum resistance RIL_max may, for example, be about 150 Ohms.

In embodiments, if controller 90 detects/indicates an error in network 12 and/or HVIL test loop 100, controller 90 may be configured to shut off/power down network 12 and/or the portion of network 12 in which the error was detected.

With embodiments, HVIL test loop 100 may comprise by a single electrically conductive path that may include a plurality of electrical conductors (e.g., wires, terminals, connectors, etc.) electrically connected in series with each other. HVIL test loop 100 may be connected and/or routed through high voltage connectors, covers, and/or one or more detectors to ensure electrical continuity between each component/device and generator 40. In embodiments, monitoring system 12 may include a plurality of HVIL test loops 100. One or more HVIL test loops 100 may be connected to respective dedicated generators 40, and/or a plurality of HVIL test loops may be connected to the same generator 40.

In embodiments, a detector 60 may be connected to one or more components that may be configured to cover or connect high voltage components, and controller 90 may be configured to detect (e.g., via detector 60) whether such covers and connectors are properly positioned (e.g., to prevent bodily injury) and/or whether there is some other error or malfunction in high voltage network 12.

With embodiments, monitoring system 30 may include a plurality of detectors (e.g., detector 60, 60', 60") and each detector may be associated and/or connected with one or more covering or connecting components. For example, and without limitation, detector 60 may be integrated with power source 14, and/or may be connected to a cover 14A of power source 14, a first connector 14B of power source 14, a second connector 14C of power source 14, a cover 16A of junction box 16, connectors 16B, 16C, 16D, 16E of junction box 16, a cover 20A of charger 20, a connector 20B of charger 20, and/or a connector 18C of inverter 18. Detector 60' may, for example, be integrated with charger 20 and/or connected to a connector 20C of charger 20. Detector 60" may, for example, be integrated with inverter 18, and/or may be connected to a cover 18A of inverter 18 and/or a connector 18B of inverter. Monitoring system 30 may include a detector 60, 60', 60" for each controller (e.g., controllers 90, 92, 94) and each detector may be connected to a respective controller and/or integrated with a respective network device. For example, and without limitation, controller 90 may be connected and/or integrated with detector 60 and/or power source 14. Controller 92 may be connected and/or integrated with detector 60' and/or inverter 18. Controller 94 may be connected and/or integrated with detector 60" and/or charger 20. Providing a detector for each controller may allow for efficient action to be taken in the event of an error as the detector may communicate directly with the component controller (e.g., without needing to communicate via a central controller, although such communication may still take place). For example, and without limitation, if information obtained via detector 60' suggests that an error has occurred, controller 94 may be configured to immediately shut charger 20 down without waiting for detector 60' to communicate with a central controller (e.g., controller 90 via a car area network (CAN)) and then for the central controller to communicate with controller 94.

HVIL test loop 100 may comprise a single conductive path, which may permit each detector 60, 60', 60" to be electrically connected, directly or indirectly, with each other and each cover, connector, and/or component. Accordingly, an error anywhere in HVIL test loop 100 may be independently and/or simultaneously (or nearly simultaneously) detected by each detector 60, 60', 60" connected with/in HVIL test loop 100. If an error is detected by at least one detector 60, 60', 60" but is not detected by one or more of the other detectors 60, 60", 60", controller 90 may indicate that a detector error has occurred.

In embodiments, generator 40 and/or one or more detectors 60 may, for example, be disposed in/integrated with power source 14 (e.g., within a battery junction box).

Although certain determinations may be made by system 12 with respect to certain values being greater than or less than other values, it should be understood that such determinations could be modified such that system determines whether certain values are greater than or equal to, or less than or equal to other values.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "in embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional. Any directional references (e.g., plus, minus, upper, lower, upward, downward, left, right, leftward, rightward, top, bottom, above, below, vertical, horizontal, clockwise, and counterclockwise) are used for identification purposes to aid the reader's understanding of the present disclosure, and do not create limitations, particularly as to the position, orientation, or use of embodiments.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

What is claimed is:

1. A high voltage power monitoring system comprising:
   a controller;
   a detector connected to the controller; and
   a generator connected to the detector and the controller, the generator configured to generate a plurality of test signals according to control signals provided by the controller, and provide the test signals to the detector;
   wherein the detector is configured to provide the plurality of test signals to a test loop, the detector is configured to sense a first voltage, a second voltage, a first current, and a second current, wherein the first voltage and the first current correspond to a first test signal of the plurality of test signals, and the second voltage and the second current correspond to a returned version of the first test signal that has passed through the test loop.

2. The monitoring system of claim 1, wherein the controller is configured to provide an indication of an error if either (i) a test loop resistance is not within a defined or expected resistance range, or (ii) if the first current and the second current are not within a defined or expected current range.

3. The monitoring system of claim 1, wherein the detector is configured to determine the first current and the second current when the generator is in a first system mode, and the detector is configured to determine a third current and a fourth current when the generator is in a second system mode.

4. The monitoring system of claim 3, wherein, in the second system mode, the generator is configured to generate a second test signal of the plurality of test signals, the third current corresponds to the second test signal, and the fourth current corresponds to a returned version of the second test signal that has passed through the test loop.

5. The monitoring system of claim 4, wherein the first test signal and the second test signal define a single common mode signal or a single differential mode signal.

6. The monitoring system of claim 4, wherein the controller is configured to provide an indication of an error if one or more of (i) the first current is not within a first expected current range of the second current, (ii) the third current is not within a second expected current range of the fourth current, or (iii) the first current is not within a third expected current range of the third current.

7. The monitoring system of claim 6, wherein if (i) the first current is greater than the second current, and (ii) the first current is greater than the fourth current, the indication of the error comprises an indication that the error includes a short to ground at a first node of the detector.

8. The monitoring system of claim 6, wherein if (i) the first current is greater than the second current, and (ii) the first current is less than the fourth current, the indication of the error comprises an indication that the error includes a short to ground at a second node of the detector.

9. The monitoring system of claim 6, wherein if (i) the first current is less than the second current, and (ii) the third current is greater than the second current, the indication of the error comprises an indication that the error includes a short to a low voltage source at a second node of the detector.

10. The monitoring system of claim 6, wherein if (i) the first current is less than the second current, and (ii) the third current is less than the second current, the indication of the error comprises an indication that the error includes a short to a low voltage source at a first node of the detector.

11. The monitoring system of claim 4, wherein, in the second system mode, the detector is configured to sense a third voltage and a fourth voltage, the third voltage corresponding to the second test signal, and the fourth voltage corresponding to a returned version of the second test signal that has passed through the test loop.

12. The monitoring system of claim 11, wherein the controller is configured to determine a test loop resistance according to at least one of (i) the first voltage, the second voltage, and the first current, and (ii) the third voltage, the fourth voltage, and the fourth current.

13. The monitoring system of claim 12, wherein if the test loop resistance is less than a minimum resistance value, the controller is configured to provide an indication of a short circuit in the test loop; and, if the test loop resistance is greater than a maximum resistance value, the controller is configured to provide an indication of an open circuit in the test loop.

14. The monitoring system of claim 4, wherein the first test signal includes a first polarity; the second test signal includes a second polarity; and, the first polarity is an opposite of the second polarity.

15. The monitoring system of claim 4, wherein the detector is a first detector, and the monitoring system further comprises a second detector.

16. A high voltage monitoring system comprising:
   a detector configured to communicate with a controller; and
   a generator connected to the detector and configured to communicate with the controller, the generator configured to generate a test signal according to a control signal provided by the controller, and provide the test signal to the detector, the test signal including a first state and a second state;

wherein the generator is configured to provide the test signal to a test loop via the detector; the detector is configured to sense a first voltage, a first current, a second voltage, and a second current; the first voltage and the first current correspond to the test signal in its first state; and, the second voltage and the second current correspond to a returned version of the test signal in its first state that has passed through the test loop;

wherein the detector is configured to sense a third voltage, a third current, a fourth voltage, and a fourth current; the third voltage and the third current correspond to the test signal in its second state; and, the fourth voltage and the fourth current correspond to a returned version of the test signal in its second state that has passed through the test loop.

17. The monitoring system of claim 16, wherein the detector is a first detector, the controller includes a first controller and a second controller, and the monitoring system further comprises a second detector configured to communicate with the second controller.

18. The monitoring system of claim 17, wherein the first detector is configured for integration with a high voltage power source, the second detector is configured for integration with a charger, the controller includes a third controller, the monitoring system further comprises a third detector, and the third controller and the third detector are integrated with an inverter.

19. The monitoring system of claim 17, wherein the first controller and the second controller are configured to independently detect errors in the test loop via the first detector and the second detector, respectively; the first controller is configured to control a high voltage power source and shut down the high voltage power source if the first controller detects an error via the first detector; and, the second controller is configured to control a charger and shut down the charger if the second controller detects an error via the second detector.

20. The monitoring system of claim 16, wherein the test loop comprises a single electrically conductive path including connectors and covers of a plurality of high voltage devices.

21. The monitoring system of claim 16, wherein the generator is configured to generate a pulse signal to determine a location of a fault in the test loop.

\* \* \* \* \*